(12) United States Patent
Wakabayashi

(10) Patent No.: US 11,404,299 B2
(45) Date of Patent: Aug. 2, 2022

(54) SUBSTRATE TRANSFER MECHANISM, SUBSTRATE PROCESSING APPARATUS, AND SUBSTRATE PROCESSING METHOD

(71) Applicant: Tokyo Electron Limited, Tokyo (JP)

(72) Inventor: Shinji Wakabayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 153 days.

(21) Appl. No.: 16/554,433

(22) Filed: Aug. 28, 2019

(65) Prior Publication Data

US 2020/0075377 A1 Mar. 5, 2020

(30) Foreign Application Priority Data

Sep. 3, 2018 (JP) .............................. JP2018-164629

(51) Int. Cl.
*H01L 21/677* (2006.01)
*H01L 21/67* (2006.01)
(Continued)

(52) U.S. Cl.
CPC .. *H01L 21/67754* (2013.01); *H01L 21/67196* (2013.01); *H01L 21/67201* (2013.01);
(Continued)

(58) Field of Classification Search
CPC ......... H01L 21/67754; H01L 21/67196; H01L 21/67201; H01L 21/67742; H01L 21/67745; H01L 21/68707
See application file for complete search history.

(56) References Cited

U.S. PATENT DOCUMENTS

2010/0068009 A1* 3/2010 Kimura ............. H01L 21/67778
414/217.1
2014/0030048 A1* 1/2014 Kosuge ............. H01L 21/67313
414/225.01
(Continued)

FOREIGN PATENT DOCUMENTS

JP 2006-294786 A 10/2006
KR 10-2008-0039775 A 5/2008
KR 10-2014-0044278 A 4/2014

OTHER PUBLICATIONS

English Translation KR20080039775 from Google Translate on Dec. 14, 2021.*

*Primary Examiner* — Saul Rodriguez
*Assistant Examiner* — Ashley K Romano
(74) *Attorney, Agent, or Firm* — Fenwick & West LLP

(57) ABSTRACT

In a substrate transfer mechanism, a moving body moves horizontally, and a support body is provided at the moving body to rotate about a vertical shaft. A first rotary shaft and a second rotary shaft are disposed vertically. A first arm forms a first substrate support region for supporting a first substrate, the first arm having a base portion connected to the first rotary shaft and a tip portion rotating at an outer side of the support body. A second arm forms a second substrate support region for supporting a second substrate, the second arm having a base portion connected to the second rotary shaft and a tip portion rotating the outer side of the support body. Further, an elevating mechanism is configured to raise and lower the second rotary shaft depending on a direction of the second arm with respect to the support body.

16 Claims, 13 Drawing Sheets

(51) Int. Cl.
*H01L 21/68* (2006.01)
*H01L 21/687* (2006.01)

(52) U.S. Cl.
CPC .. *H01L 21/67742* (2013.01); *H01L 21/67745* (2013.01); *H01L 21/68707* (2013.01)

(56) References Cited

U.S. PATENT DOCUMENTS

| | | | |
|---|---|---|---|
| 2015/0133044 A1* | 5/2015 | Kumagai | H01L 21/681 |
| | | | 454/284 |
| 2016/0247707 A1* | 8/2016 | Hashimoto | H01L 21/67778 |
| 2016/0329227 A1* | 11/2016 | Hashimoto | H01L 21/67781 |
| 2019/0093219 A1* | 3/2019 | Hayashi | H01L 21/67196 |
| 2019/0355599 A1* | 11/2019 | Shindo | H01L 21/6719 |
| 2020/0075376 A1* | 3/2020 | Fukasawa | H01L 21/68707 |

* cited by examiner

US 11,404,299 B2

SUBSTRATE TRANSFER MECHANISM, SUBSTRATE PROCESSING APPARATUS, AND SUBSTRATE PROCESSING METHOD

CROSS-REFERENCE TO RELATED APPLICATION

This application claims priority to Japanese Patent Application No. 2018-164629, filed on Sep. 3, 2018, the entire contents of which are incorporated herein by reference.

TECHNICAL FIELD

The present disclosure relates to a substrate transfer mechanism, a substrate processing apparatus, and a substrate transfer method.

BACKGROUND

As an apparatus for manufacturing semiconductor devices, there is known an apparatus including a processing unit for processing a semiconductor wafer (hereinafter referred to as a "wafer") that is a substrate, and a substrate transfer mechanism for transferring the wafer to the processing unit. As the substrate transfer mechanism, Japanese Patent Application Publication No. 2006-294786 discloses a substrate transfer robot that includes a hand unit for supporting four wafers at a tip portion of an articulated arm and is configured to transfer four wafers at one time.

SUMMARY

The present disclosure provides a technique capable of increasing a degree of freedom in the arrangement of substrates in a module to which the substrates are transferred and the transfer mode of the substrates between modules.

In accordance with an aspect of the present disclosure, there is provided a substrate transfer mechanism comprising: a moving body moving horizontally; a support body provided at the moving body to rotate about a vertical shaft; a first rotary shaft and a second rotary shaft disposed vertically while being spaced apart from each other in a horizontal direction of the support body; a first arm forming a first substrate support region for supporting a first substrate, the first arm having a base portion connected to the first rotary shaft and a tip portion rotating at an outer side of the support body; a second arm forming a second substrate support region for supporting a second substrate, the second arm having a base portion connected to the second rotary shaft and a tip portion rotating the outer side of the support body; and an elevating mechanism configured to raise and lower the second rotary shaft depending on a direction of the second arm with respect to the support body to avoid interference between the first arm and the second arm.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
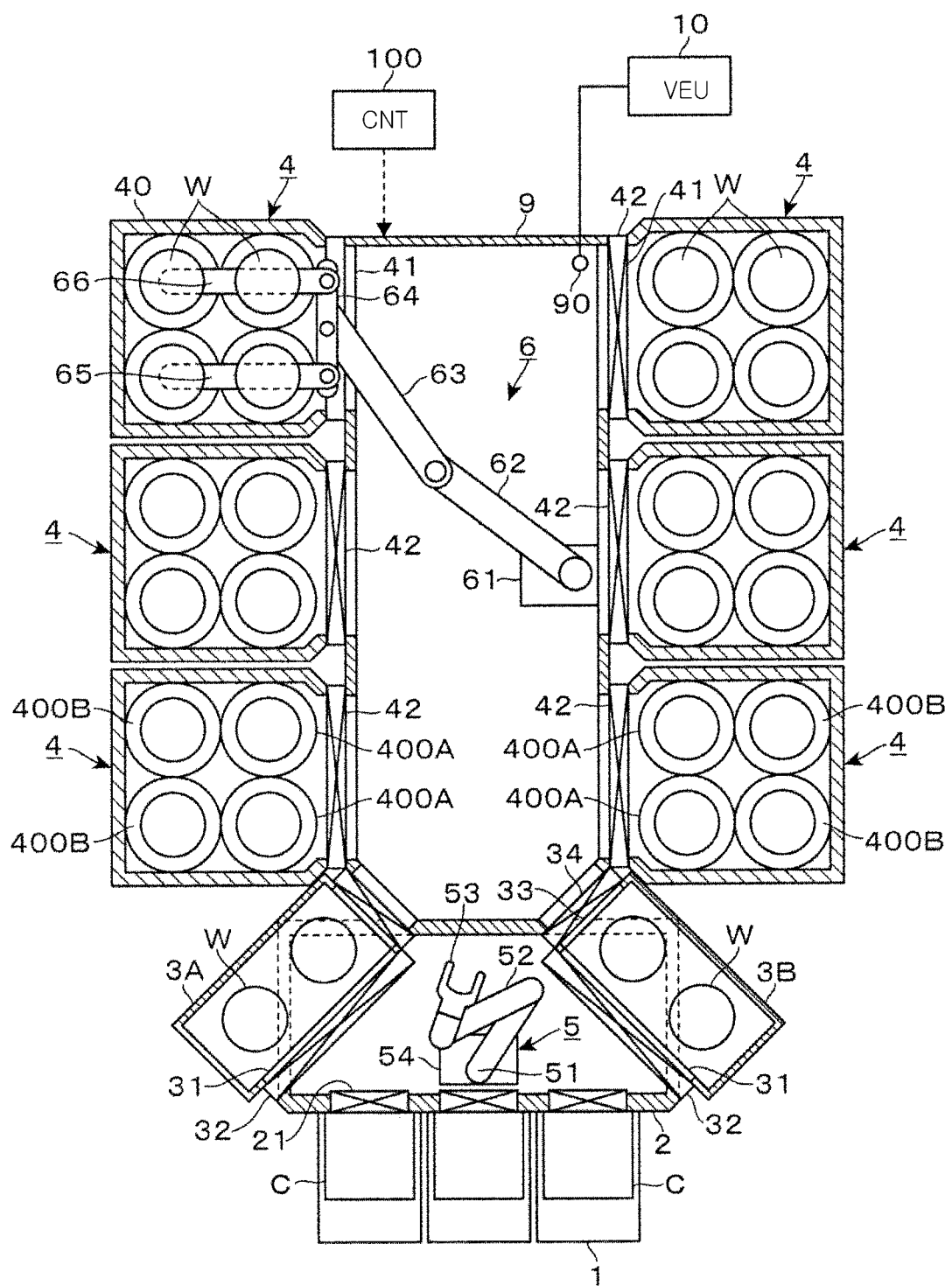
FIG. 1 is a plan view showing a substrate processing apparatus according to an embodiment.
Figure 2:
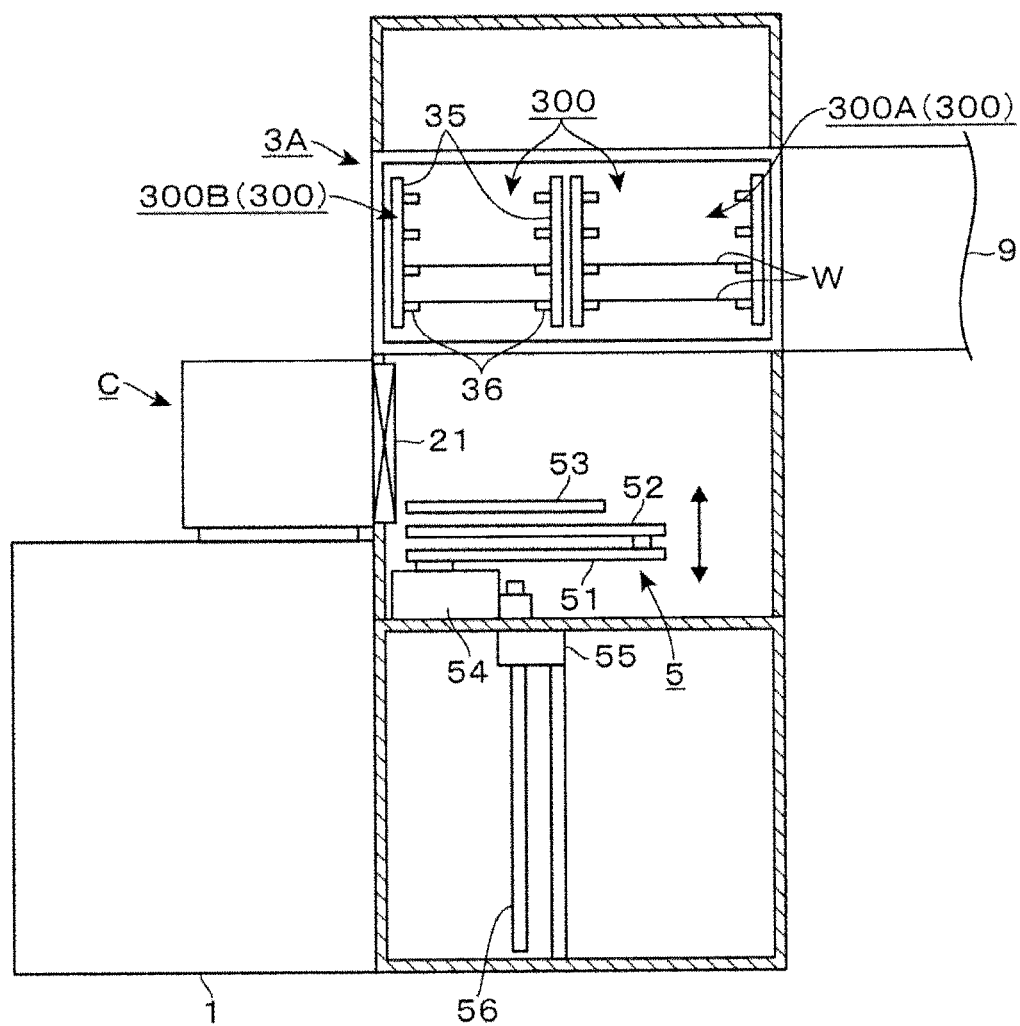
FIG. 2 is a longitudinal cross-sectional view showing a part of the substrate processing apparatus.

Hereinafter, a substrate processing apparatus according to an embodiment of the present disclosure will be described. As shown in FIGS. 1 and 2, the substrate processing apparatus includes a loader module 2 of which inner atmosphere is set to a normal pressure atmosphere. For example, three loading/unloading ports 1, each for mounting a carrier C as a transfer container for wafers W, are arranged side by side in a right-left direction in the loader module 2. A reference numeral 21 in FIG. 1 denotes a door that is opened and closed together with a lid of the carrier C.

The loader module 2 includes a transfer arm 5 for transferring the wafer W. The transfer arm 5 is configured as an articulated arm in which a lower arm 51, an upper arm 52, and a wafer holder 53 are connected in that order from a lower side via rotating shafts (not shown). The entire articulated arm is configured to rotate or reciprocate by a motor (not shown) provided in a case 54. In this example, the transfer arm 5 is configured to be raised to the height of load-lock modules 3A and 3B to be described later along a guide rail 56 by an elevating mechanism 55.

As shown in FIG. 1, the load-lock modules 3A and 3B having a rectangular shape when viewed from above are provided at a left side and a right side of the loader module 2 when viewed from the loading/unloading port 1, respectively. The inner atmospheres of the load-lock modules 3A and 3B can be switched between a vacuum atmosphere and a normal pressure atmosphere. As shown in FIG. 1, the load-lock modules 3A and 3B are inclined with respect to the loader module 2 when viewed from above, and the loader module 2 is formed in a substantially trapezoidal shape having a long side on the loading/unloading port 1 side when viewed from above.

Side surfaces forming the long sides of the load-lock modules 3A and 3B are connected to the loader module 2, and transport ports 31 are formed on the side surfaces. Side surfaces forming the short sides of the load-lock modules 3A and 3B are connected to a transfer chamber 9 to be described later, and transfer ports 33 are formed on the side surfaces. The transfer ports 31 and 33 are opened and closed by gate valves 32 and 34, respectively.

As shown in FIG. 2, mounting shelves 300 for mounting thereon wafers W are provided in the load-lock modules 3A and 3B. For example, the mounting shelves 300 are configured to mount two wafers W horizontally and spaced apart from each other vertically when viewed from the loader module 2 side.

Figure 3:
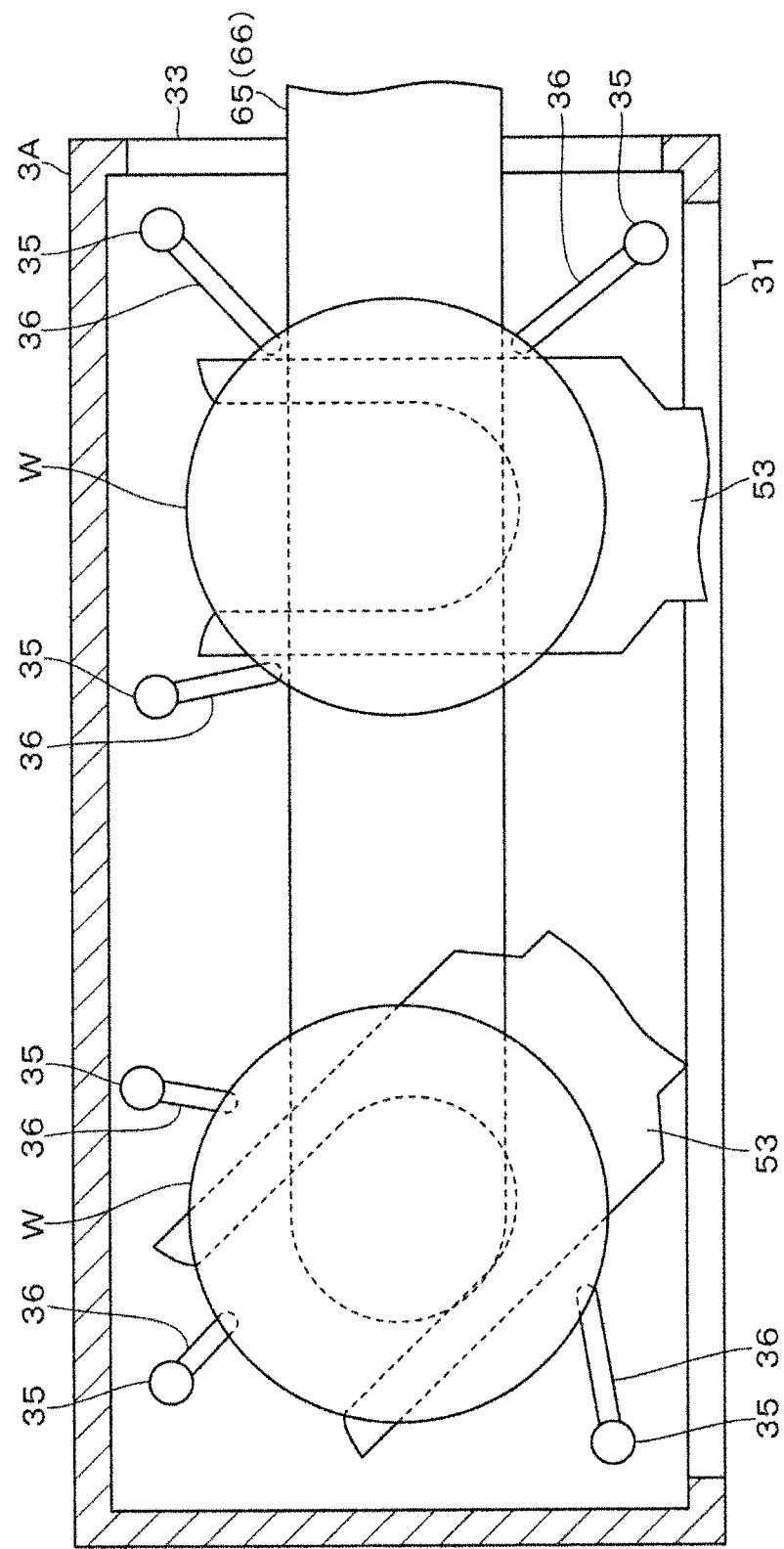
FIG. 3 is a plan view showing a part of the substrate processing apparatus.

As shown in FIG. 3, for example, the mounting shelf 300 includes three columns 35 and cantilever-type claws 36 spaced apart from each other in a longitudinal direction of each column 35 to support the peripheral portions of the wafers W. In the mounting shelf 300, the wafer W is delivered to and from the transfer arm 5 via the transfer port 31 and delivered to and from a substrate transfer mechanism 6 to be described later via the transfer port 33. Therefore, the shapes and the installation positions of the columns 35 and the claws 36 are set such that the wafers W can be delivered to and from the transfer arm 5 and the substrate transfer mechanism 6 without interference with each other.

In this example, a plurality of mounting shelves 300 is arranged in vertical stages. The mounting shelves 300 of the load-lock module 3A mount thereon, e.g., unprocessed wafers, and the mounting shelves 300 of the load-lock module 3B mount thereon, e.g., processed wafers. In the following description, the mounting shelf on the front side when viewed from the transfer chamber 9 side is referred to as a "mounting shelf 300A", and the mounting shelf on the rear side when viewed from the transfer chamber 9 side is referred to as a "mounting shelf 300B".

Referring back to FIG. 1, the transfer chamber 9 is formed in a substantially rectangular shape extending in a back-and-forth direction when viewed from above. The transfer chamber 9 is connected to a vacuum exhaust unit (VEU) 10 via a gas exhaust port 90 formed at, e.g., a bottom portion of the transfer chamber 9. A plurality of, e.g., three processing modules 4, are arranged side by side in the back-and-forth direction on the right side and the left side of the transfer chamber 9 when viewed from the loading/unloading port 1. The transfer chamber 9 includes the substrate transfer mechanism 6 for delivering the wafers W to and from the load-lock modules 3A and 3B and the processing modules 4.

Figure 4:
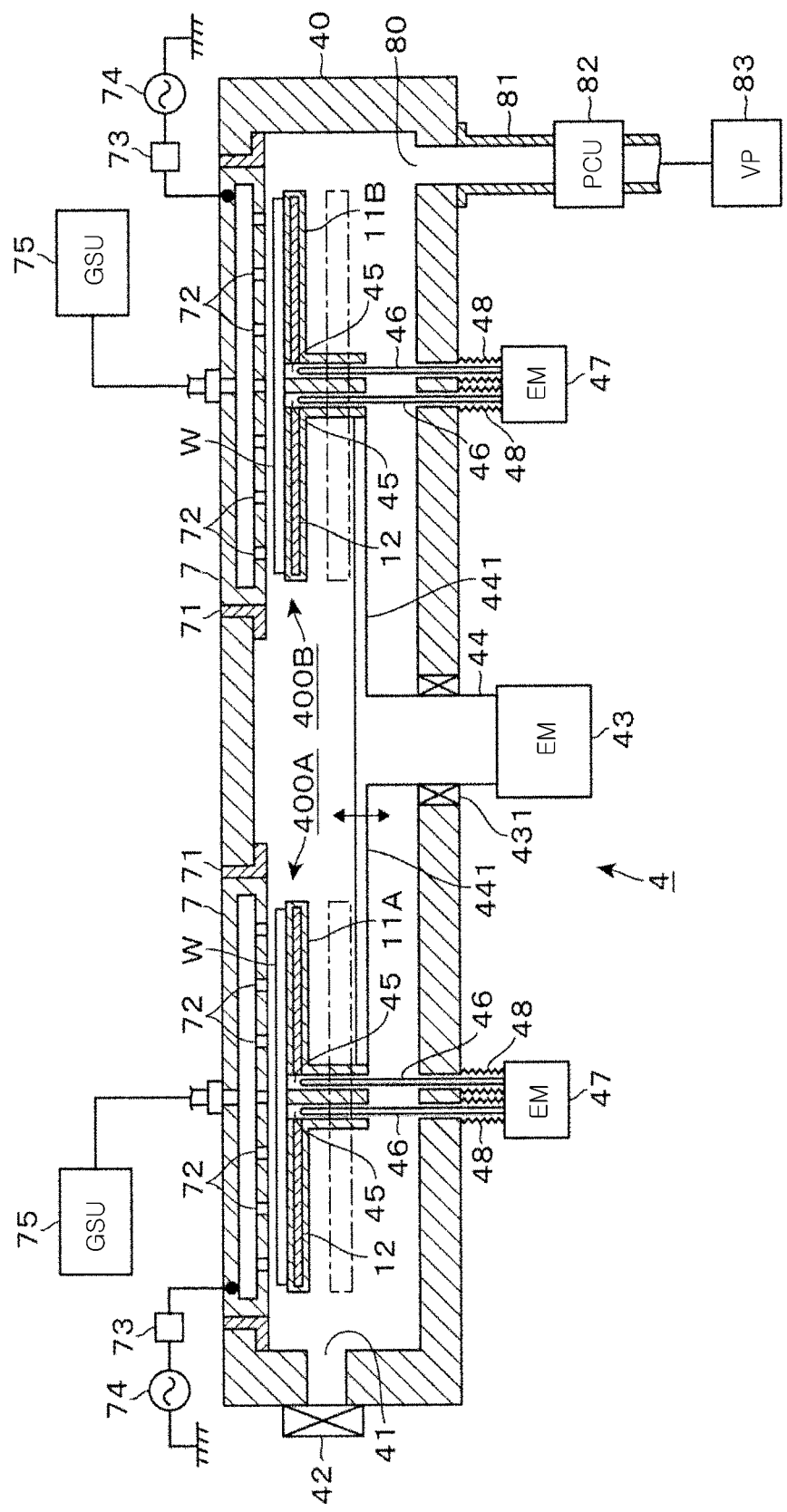
FIG. 4 is a longitudinal cross-sectional view showing an example of a processing module.

Prior to the description of the substrate transfer mechanism 6, the case in which the processing module 4 is a film forming apparatus for forming a film on a wafer W by plasma atomic layer deposition (ALD) will be described. The processing module 4 in this example processes the wafer W in a vacuum atmosphere. As shown in FIGS. 1 and 4, the processing module 4 includes a processing chamber 40 having a rectangular shape when viewed from above, and a loading/unloading port 41 for the wafer W is formed on a sidewall of the processing chamber 40 on the transfer chamber 9 side. The loading/unloading port 41 is opened and closed by a gate valve 42. A reference numeral 80 in FIG. 4 denotes a gas exhaust port that is opened on the bottom surface of the processing chamber 40. The gas exhaust port 80 is connected to a vacuum pump (VP) 83 by a gas exhaust line 81 provided with a pressure control unit (PCU) 82.

In the processing chamber 40, processing units 400A and 400B are arranged in rows in that order from the front side toward the rear side when viewed from the loading/unloading port 41. The rows of the processing units 400A and 400B are arranged side by side when viewed from the loading/unloading port 41. The processing units 400A and 400B include mounting tables 11A and 11B for mounting thereon the wafers W, respectively. Therefore, four wafers W are mounted in a 2×2 matrix shape when viewed from above in the processing chamber 40. The mounting tables 11A and 11B are formed in, e.g., a cylindrical shape having a flat upper surface, and have therein heaters 12 for heating the wafers W.

The wafers W mounted on the mounting tables 11A and 11B are arranged at the same interval as that of the wafers W mounted on the mounting shelves 300A and 300B of the load-lock modules 3A and 3B. The four mounting tables 11A and 11B in the processing chamber 40 are connected by a support arm 441 to an elevating member (EM) 43 provided below the processing chamber 40 via a common column 44. Therefore, the four mounting tables 11A and 11B are simultaneously raised and lowered between a processing position indicated by a solid line in FIG. 4 where film formation is performed and a delivery position indicated by a dotted line in FIG. 4 where the wafer W is transferred. A reference numeral 431 in FIG. 4 denotes a sealing member for maintaining the processing chamber 40 in an airtight state.

Figure 5:
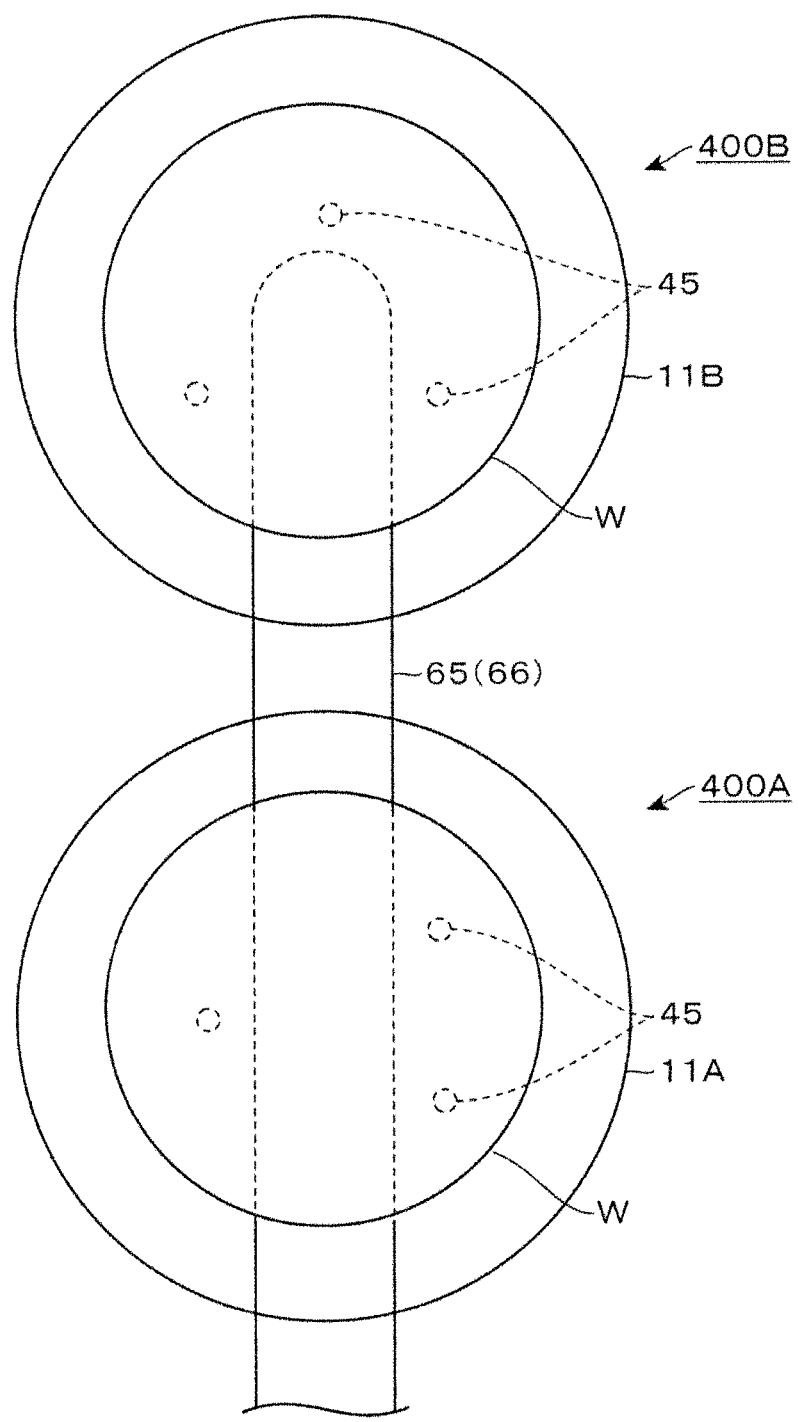
FIG. 5 is a plan view showing a part of the processing module.

Each of the mounting tables 11A and 11B is provided with, e.g., three lift pins 46 that are raised and lowered by an elevating member (EM) 47 to deliver the wafer W to and from the substrate transfer mechanism 6. In FIGS. 4 and 5, a reference numeral 45 denotes through-holes for the lift pins 46, and a reference numeral 48 denotes a sealing member. As shown in FIG. 5, the lift pins 46 do not interfere with a first arm 65 and a second arm 66 of the substrate transfer mechanism 6 when the first arm 65 and the second arm 66 enter the processing module 4 to deliver the wafer W. The first arm 65 and the second arm 66 will be described later. In FIG. 4, the gap between the lift pins 46 is small for convenience of illustration.

Gas shower heads 7 serving as upper electrodes are provided at upper portions of the processing units 400A and 400B via insulating members 71, respectively. The bottom surfaces of the gas shower heads 7 face the mounting tables 11A and 11B, and a plurality of gas injection holes 72 is distributed on the bottom surfaces of the gas shower heads 7. High frequency power supplies 74 are connected to the gas shower head 7 via matching units 73. Lower electrodes (not shown) are embedded in the mounting tables 11A and 11B, and are connected to the ground potential. A reference numeral 75 in FIG. 4 denotes a gas supply unit (GSU) for supplying, e.g., titanium tetrachloride ($TiCl_4$) as a source gas containing a titanium (Ti) element that is a source of a film to be formed to the gas shower head 7. A gas containing hydrogen (H2) gas and argon (Ar) gas is supplied, as a reactant gas to react with the source gas, independently from the source gas.

A process of forming a film on the wafer W in the processing module 4 will be briefly described. The wafers W are mounted on the four mounting tables 11A and 11B at the delivery position and then heated by the heaters 12. At the same time, the mounting table 11A and 11B are moved to the processing position. Next, the source gas is supplied from the gas shower head 7 and adsorbed onto the surface of the wafer W. Thereafter, the reaction gas is supplied from the gas shower head 7, and a high frequency power is supplied from the high frequency power supply 74 to a space between the lower electrodes in the mounting tables 11A and 11B and the gas shower head 7. Accordingly, the reaction gas is turned to plasma by capacitive coupling and reacts with the source gas adsorbed onto the surface of the wafer W. In this manner, a Ti layer is laminated on the surface of the wafer W by plasma ALD method in which the adsorption and the reaction are alternately repeated, thereby forming a Ti film having a given film thickness.

Hereinafter, the substrate transfer mechanism 6 will be described with reference to the schematic views of FIGS. 1, 6 and 7 and the partial cross-sectional view of FIG. 8. The substrate transfer mechanism 6 is configured as an articulated arm in which a base 61, a first moving body 62, a second moving body 63, and a rotating body 64 are connected in that order from a lower side. The base 61 is deviated to the right side from the central portion in the back-and-forth direction in the transfer chamber 9, and is configured to be raised and lowered by an elevating member (not shown).

Each of the first moving body 62 and the second moving body 63 is formed as a thin and long plate-shaped body extending horizontally. The first moving body 62 is configured to move horizontally when a base portion thereof rotates about a vertical rotary shaft 611 on the base 61. The second moving body 63 is configured to move horizontally when a base portion thereof rotates about a vertical rotary shaft 621 on a tip portion of the first moving body 62.

The rotating body 64 that is a support body for supporting a first arm and a second arm to be described later is configured to rotate about a vertical rotary shaft 631 provided at the tip portion of the second moving body 63. A first rotary shaft 651 and a second rotary shaft 661 are disposed vertically while being spaced apart from each other in the horizontal direction of the rotating body 64. In this example, the first rotary shaft 651 is provided at one longitudinal end of the rotating body 64, and the base portion of the first arm 65 is connected to the first rotary shaft 651. The second rotary shaft 661 is provided at the other longitudinal end of the rotating body 64, and the base portion of the second arm 66 is connected to the second rotary shaft 661.

Each of the first arm 65 and the second arm 66 has a thin and long spatula shape extending horizontally. The lengths of the first arm 65 and the second arm 66 are set to be longer than the length of the rotating body 64. Therefore, when the base portion of the first arm 65 rotates about the first rotary shaft 651, the tip portion thereof rotates at the outer side of the rotation body 64. When the base portion of the second arm 66 rotates about the second rotary shaft 661, the tip portion thereof rotates at the outer side of the rotating body 64. The rotary shaft 631 about which the rotating body 64 rotates is disposed on, e.g., a straight line L connecting the first rotary shaft 651 and the second rotary shaft 661 (hereinafter, referred to as a "straight line L") when viewed from above. In this example, the distance between the rotary shaft 631 and the first rotary shaft 651 is set to be equal to that between the rotary shaft 631 and the second rotary shaft 661. The straight line L extends along a longitudinal direction of the rotating body 64.

The first arm 65 forms a first substrate support region for supporting wafers W, and the second arm 66 forms a second substrate support region for supporting wafers W different from the wafers W supported by the first arm 65. The first substrate support region and the second substrate support region are in contact with the backsides of the wafers W to support the wafers W. Each of the first substrate support region and the second substrate support region supports a plurality of, e.g., two wafers W along the longitudinal directions of the first arm 65 and the second arm 66, respectively. In this example, the wafers W are supported on the backsides by the first arm 65 and the second arm 66 with a gap therebetween. Each of the first arm 65 and the second arm 66 supports regions along the diameters of the backsides of the wafers W. The widths of the first arm 65 and the second arm 66 are smaller than the diameter of the wafer W. For example, the central portions of the wafers W supported at the tip portions of the first arm 65 and the second arm 66 are supported by the tip portions of the first arm 65 and the second arms 66, respectively.

As described above, the arrangement interval of the wafers W mounted on the mounting tables 11A and 11B is the same as that of the wafers W mounted on the mounting shelves 300A and 300B of the load-lock modules 3A and 3B. Therefore, the wafers W in the processing unit 400A of the processing module 4 and the wafers W mounted on the mounting shelves 300A of the load-lock modules 3A and 3B are supported near the base portions of the first arm 65 and the second arm 66, respectively. The wafers W in the processing unit 400B of the processing module 4 and the wafers on the mounting shelves 300B of the load-lock modules 3A and 3B are supported near the tip portions of the first arm 65 and the second arm 66, respectively.

As shown in FIG. 3, for example, the first arm 65 and the second arm 66 have a shape that avoids interference with the claws 36 of the mounting shelves 300A and 300B when the first arm 65 and the second arm 66 enter the load-lock modules 3A and 3B. Further, as shown in FIG. 5, for example, the first arm 65 and the second arm 66 have a shape that avoids interference with the lift pins 46 of the processing units 400A and 400B when the first arm 65 and the second arm 66 enter the processing module 4.

In this substrate transfer mechanism 6, the rotary shaft 611 on the base 61 and the rotary shaft 621 of the first moving body 62 are connected by a belt (not shown), and the rotary shaft 621 and the rotary shaft 631 of the second moving body 63 are connected by a belt (not shown). The entire articulated arm is configured to be rotated or reciprocated by motors for rotation and reciprocation (not shown) provided in the base 61.

The first rotary shaft 651 and the second rotary shaft 661 are configured to be driven independently. For example, a motor (not shown) dedicated to the first rotary shaft 651 is provided at the base 61. The power of the motor is transmitted to a belt and a pulley dedicated to the first rotary shaft 651, which are disposed in the first moving body 62, the second moving body 63, and the rotating body 64.

The substrate transfer mechanism 6 includes an elevating mechanism for raising and lowering the second rotary shaft 661 along the direction of the second arm 66 with respect to the rotating body 64 to avoid interference between the second arm 66 and the first arm 65. For example, the direction of the second arm 66 with respect to the rotating body 64 is the longitudinal direction of the second arm 66 with respect to the longitudinal direction of the rotating body 64. For example, as shown in FIGS. 7B and 8, a screw is formed at the surface of the second rotary shaft 661 and at the connecting portion between the rotating body 64 and the rotary shaft 661. Similarly to the first rotary shaft 651, a motor (not shown) dedicated to the second rotary shaft 661 is provided at the base 61. A belt and a pulley dedicated to the second rotary shaft 661 are provided in the first moving body 62, the second moving body 63, and the rotating body 64.

Figure 8:
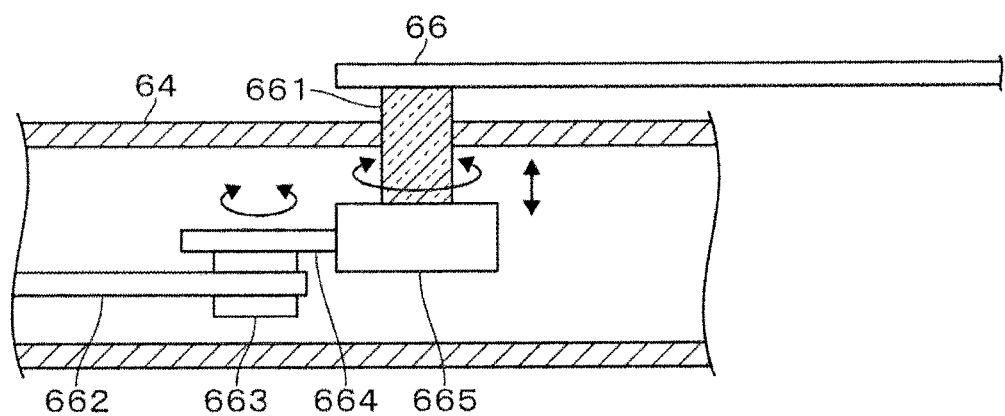
FIG. 8 is a longitudinal cross-sectional view showing a part of the substrate transfer mechanism.

FIG. 8 is a longitudinal cross-sectional view showing the vicinity of the connecting portion between the rotating body 64 and the second arm 66. In FIG. 8, a reference numeral 662 denotes a belt; a reference numeral 663 denotes a pulley; and reference numerals 664 and 665 denote gears. The power of the motor (not shown) provided at the base 61 is transmitted to the gear 664 connected to the pulley 663 via the belt 662, thereby rotating the second rotary shaft 661 via the gear 665. When the second rotary shaft 661 rotates, the height position of the second arm 66 with respect to the rotating body 64 is changed by the action of the screw. Therefore, the elevating mechanism in this example includes the screw formed at the second rotary shaft 661 and the rotating body 64, and the motor, the pulley, and the gears for rotating the second rotary shaft 661.

Figure 6A:
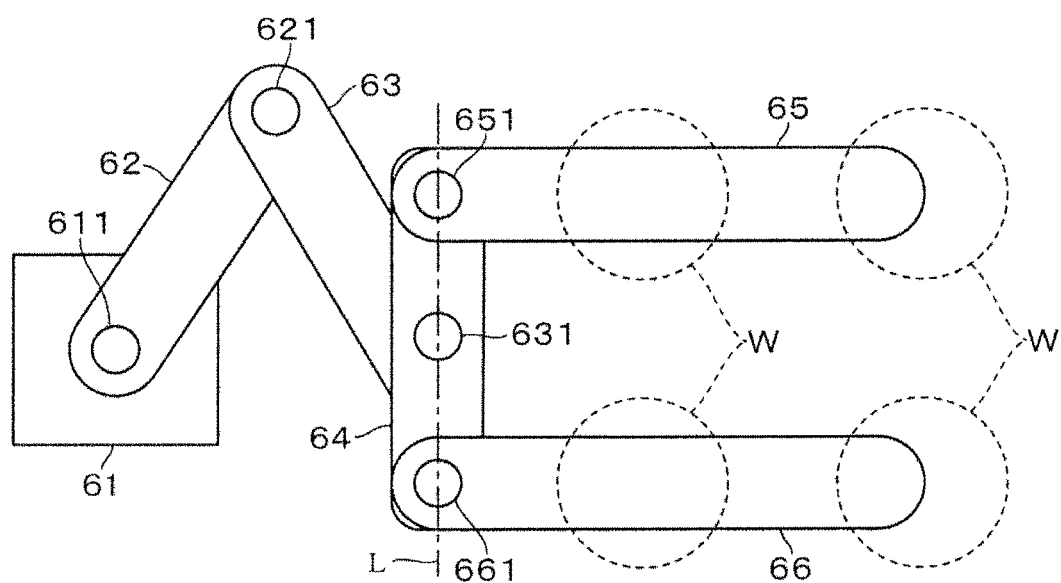
FIG. 6A is a plan view showing an example of a substrate transfer mechanism.
Figure 6B:
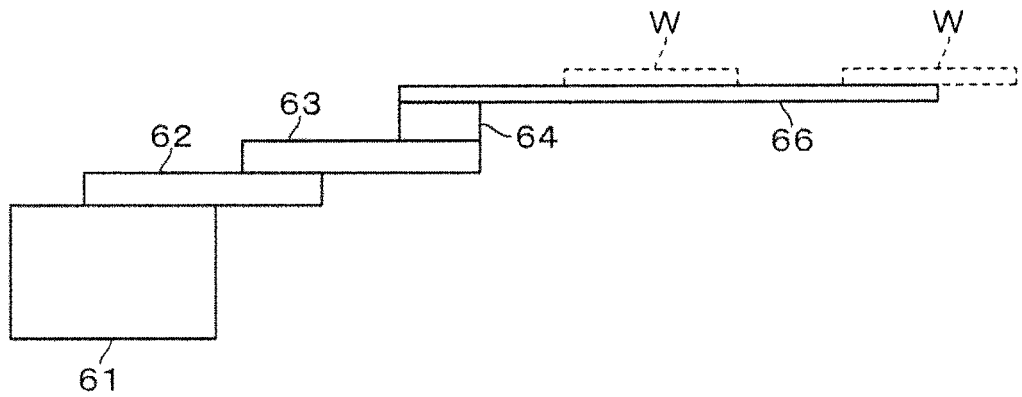
FIG. 6B is a side view of the substrate transfer mechanism.

Accordingly, as shown in FIGS. 6A and 6B, when the longitudinal directions of the first arm 65 and the second arm 66 are orthogonal to the straight line L, the height of the first substrate support region is the same as that of the second substrate support region. At this time, the direction of the first arm 65 is the same as that of the second arm 66, and the distance from the rotary shaft 631 to the first substrate support region is the same as the distance from the rotary shaft 631 to the second substrate support region. The case where the height of the first substrate support region is the same as that of the second substrate support region includes the case where the first substrate support region and the second substrate support region having the same design height have different heights due to a manufacturing error. For example, a height position error of 2 mm or less is allowable.

Figure 7A:
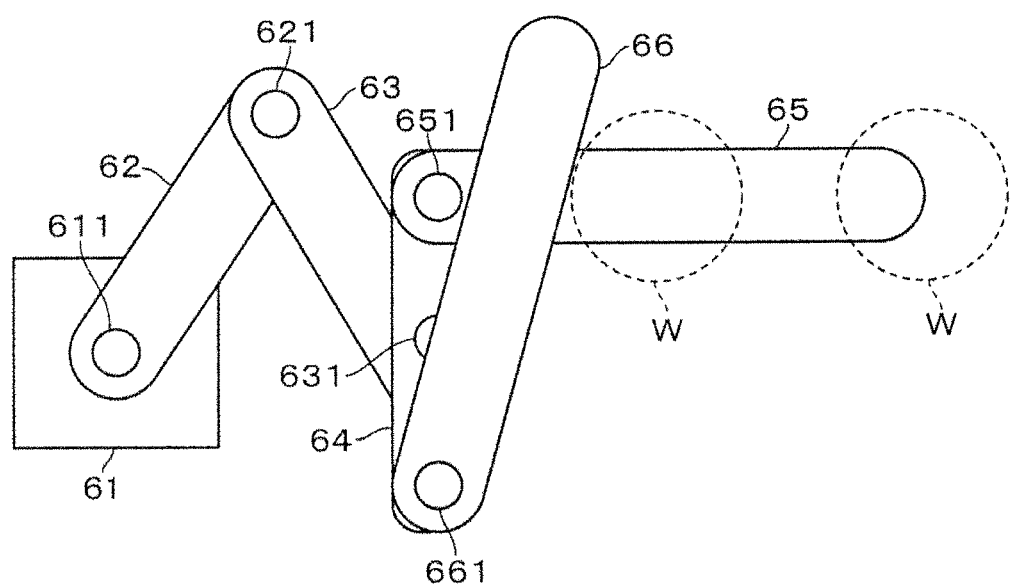
FIG. 7A is a plan view of the substrate transfer mechanism.
Figure 7B:
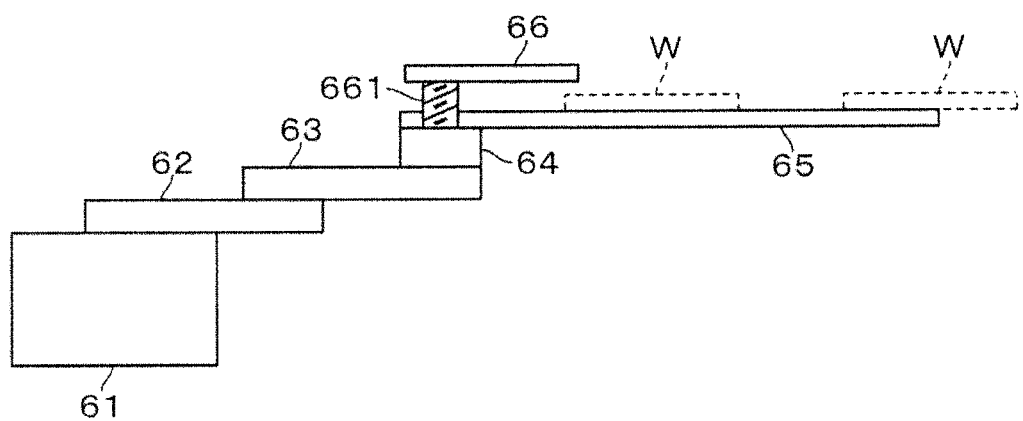
FIG. 7B is a side view of the substrate transfer mechanism.

On the other hand, when the direction of the second arm 66 with respect to the rotating body 64 changes from the state in which the longitudinal direction of the second arm 66 is orthogonal to the straight line L, the second rotary shaft 661 is raised by the elevating mechanism as shown in FIGS. 7A and 7B. When the second substrate support region is raised, the second substrate support region is disposed at a height position where a bottom surface of the second arm 66 is disposed higher than the surface of the wafer W supported by the first substrate support region to avoid the interference between the first arm 65 and the second arm 66. The relationship between the direction of the second arm 66 with respect to the rotating body 64 and the variation in the height position of the second substrate support region is appropriately set.

In the substrate transfer mechanism 6, the first arm 65 and the second arm 66 are individually rotatably connected to the rotating body 64 without interference with each other. Therefore, the posture of the substrate transfer mechanism 6 can be changed by changing the directions of the first arm 65 and the second arm 66 with respect to the rotating body 64.

Accordingly, when the wafer W is delivered to and from, e.g., the processing module 4, the substrate transfer mechanism 6 is set in a delivery posture in which each of the longitudinal directions of the first arm 65 and the second arm 66 are orthogonal to the straight line L. Then, both of the first arm 65 and the second arm 66 enter the processing module 4 to collectively transfer the four wafers W as shown in FIG. 1.

Figure 9:
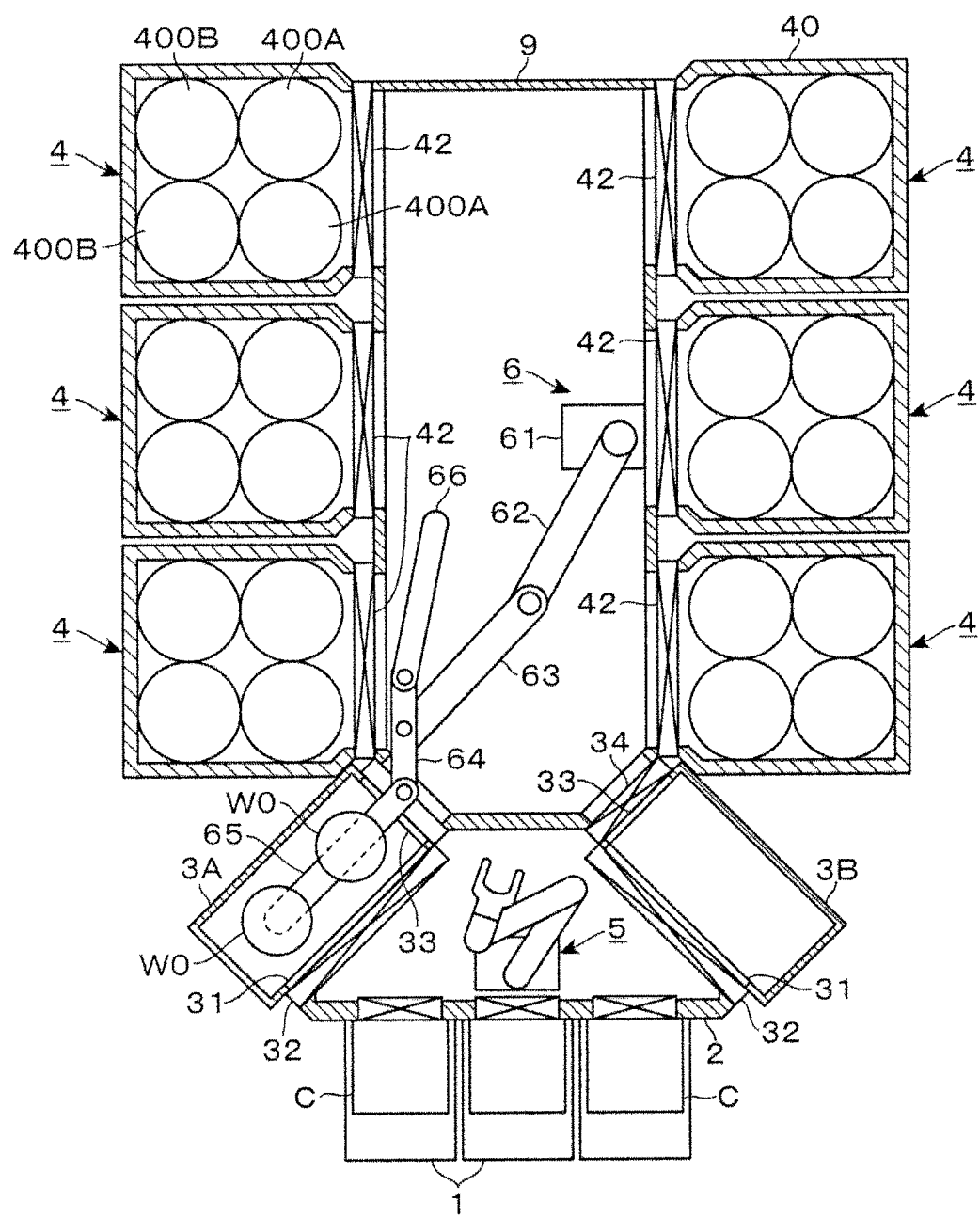
FIG. 9 is a plan view showing an operation of the embodiment of the present disclosure.
Figure 10:
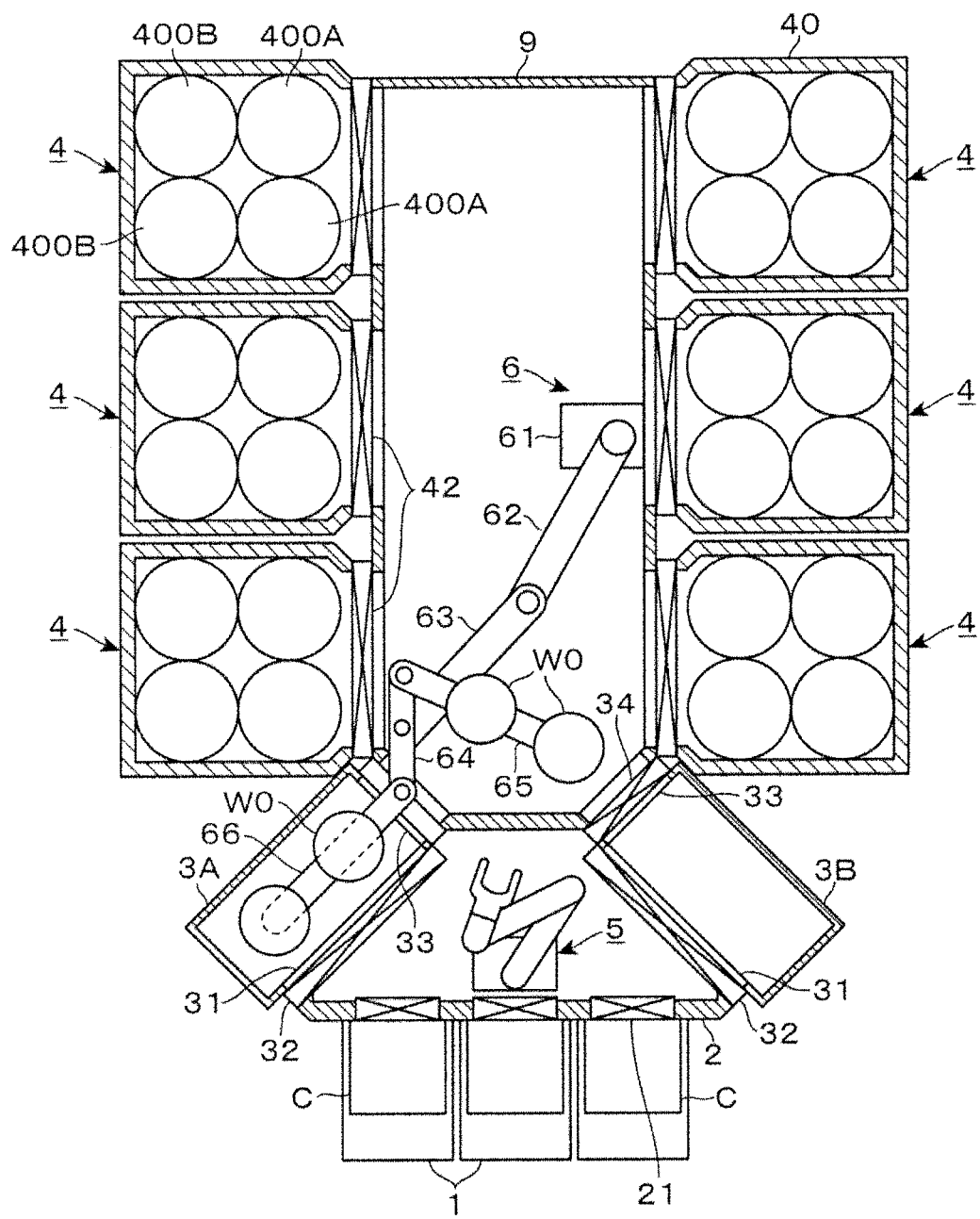
FIG. 10 is a plan view showing the operation of the embodiment of the present disclosure.

When the wafer W is delivered to and from the load-lock modules 3A and 3B, the substrate transfer mechanism 6 is set in an inclined posture in which the longitudinal directions of the first arm 65 and the second arm 66 are set to be inclined with respect to the straight line L as shown in FIGS. 9 and 10. Then, the first arm 65 and the second arm 66 individually enter the load-lock modules 3A and 3B to collectively transfer the two wafers W, respectively.

Figure 11:
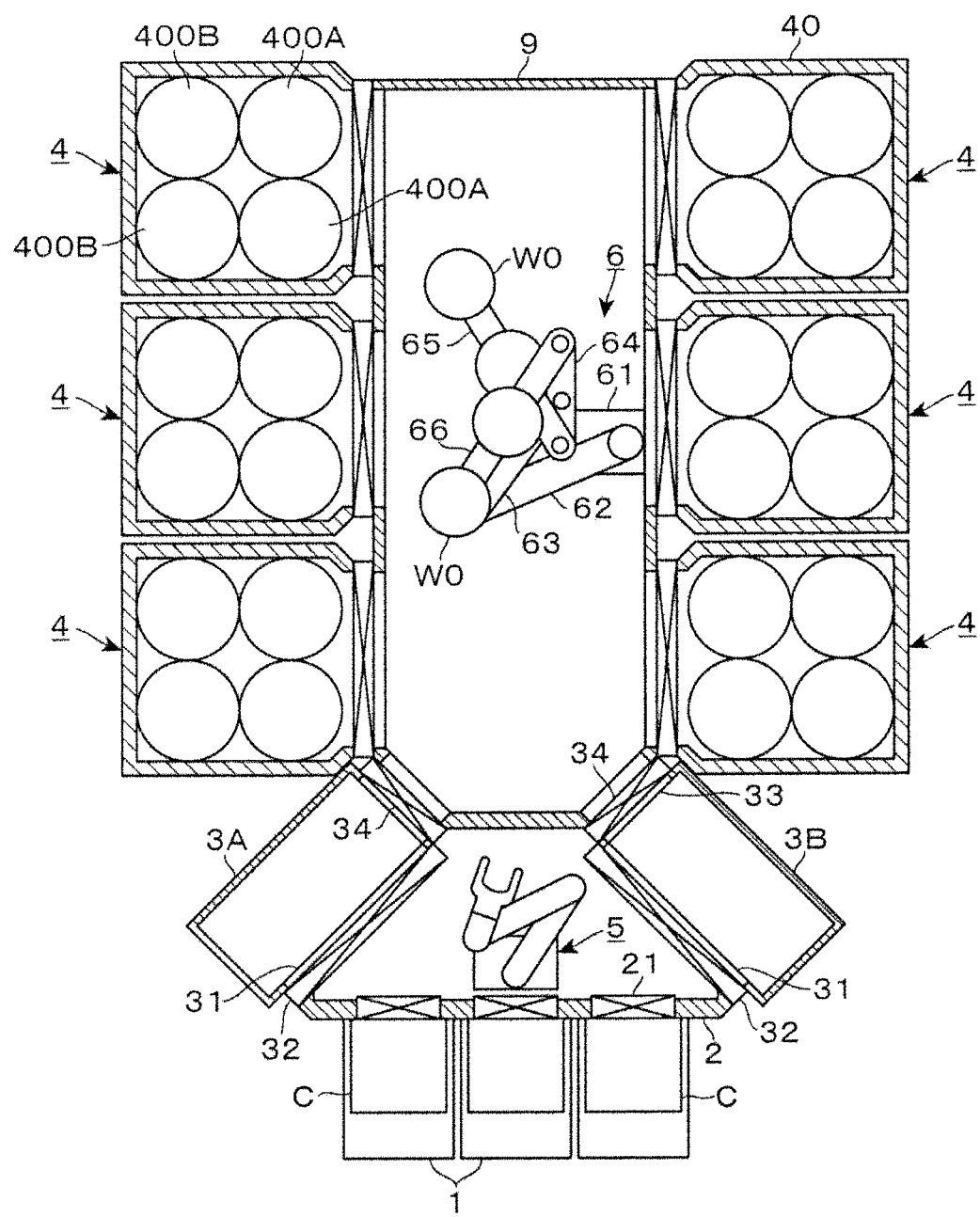
FIG. 11 is a plan view showing the operation of the embodiment of the present disclosure.

As shown in FIG. 11, when the first arm 65 and the second arm 66 move in the transfer chamber 9, the substrate transfer mechanism 6 is in a transfer posture in which the longitudinal directions of the first arm 65 and the second arm 66 are inclined with respect to the straight line L and the first arm 65 and the second arm 66 cross with each other. The postures of the first arm 65 and the second arm 66 are changed based on control signals transmitted from a control unit (CNT) 100 to the motors for the first and the second rotary shaft 651 and 661, and the motors for reciprocating and rotating the rotary shafts 611, 621, and 631. Since the driving amounts of the motors are set in advance in response to the transfer schedule of the wafer W, the movement and the posture change of the first and the second arm 65 and 66 are controlled and, then, the wafer W is delivered.

As shown in FIG. 1, the substrate processing apparatus includes the control unit 100 for controlling the transfer of the wafer W in the substrate processing apparatus, the processes such as film formation and the like in the processing module 4, and the switching of the atmosphere in the load-lock modules 3A and 3B. The control unit 100 includes a computer having a CPU (not shown) and a storage unit. The storage unit stores therein a recipe for the film formation in the processing module 4, or a program including a group of steps (commands) for transferring the wafer W using the transfer arm 5 and the substrate transfer mechanism 6 in the substrate processing apparatus. This program is stored in a storage medium such as a hard disk, a compact disk, a magnet optical disk, a memory card, or the like, and is installed on the computer therefrom.

Next, the operation of the above-described embodiment will be described. Hereinafter, an unprocessed wafer W will be referred to as an "unprocessed wafer W0". A wafer W processed in the processing unit 400A is referred to as a "wafer WA", and a wafer W processed in a processing unit 400B is referred to as a "wafer WB".

As shown in FIG. 9, when the carrier C containing the unprocessed wafers W0 is mounted on the loading/unloading port 1, the transfer arm 5 takes out the unprocessed wafers W0 from the carrier C sequentially. Then, the gate valve 32 of the load-lock module 3A is opened to sequentially deliver the unprocessed wafers W0 to the wafer mounting shelves 300A and 300B. Thereafter, the gate valve 32 is closed to switch the atmosphere in the load-lock module 3A from the normal pressure atmosphere to the vacuum atmosphere.

Next, for example, the gate valve 34 of the load-lock module 3A is opened, the directions of the first arm 65 and the second arm 66 in the substrate transfer mechanism 6 are changed, and the first arm 65 enters the load-lock module 3A. Then, the first arm 65 is positioned below the unprocessed wafers W0 mounted on the uppermost mounting shelves 300A and 300B and raised to lift and hold the two unprocessed wafers W0 simultaneously. Then, the first arm 65 holding the unprocessed wafer W0 is retracted to the transfer chamber 9.

Next, as shown in FIG. 10, the directions of the first arm 65 and the second arm 66 in the substrate transfer mechanism 6 are changed, and the second arm 66 enters the load-lock module 3A. Then, the second arm 66 holds the unprocessed wafers W0 mounted on the second mounting shelves 300A and 300B from the top and is retracted to the transfer chamber 9. Thereafter, the gate valve 34 is closed.

In this manner, the first arm 65 and the second arm 66 enter the load-lock module 3A sequentially. Then, two unprocessed wafers W0 in the load-lock module 3A are collectively unloaded by the first arm 65 and two unprocessed wafers W0 in the load-lock module 3A are collectively unloaded by the second arm 66. On the other hand, in the load-lock module 3A, after the unprocessed wafers W0 are unloaded, the gate valve 34 is closed to switch the atmosphere in the load-lock module 3A to the normal pressure atmosphere.

In the transfer chamber 9, the substrate transfer mechanism 6 holding four unprocessed wafers W0, e.g., the two unprocessed wafers W0 on the first arm 65 and the two unprocessed wafers W0 on the second arm 66, changes its posture to the transfer posture in which the first arm 65 and the second arm 66 cross with each other as shown in FIG. 11. Then, the substrate transfer mechanism 6 is moved by the first moving body 62 and the second moving body 63 toward the processing module 4 to which the unprocessed wafers W0 are transferred while maintaining the transfer posture. Next, the gate valve 42 of the processing module 4 to which the wafers are transferred is opened, and the first arm 65 and the second arm 66 change their posture to the delivery posture to transfer the wafers to and from the processing module 4.

Figure 12:
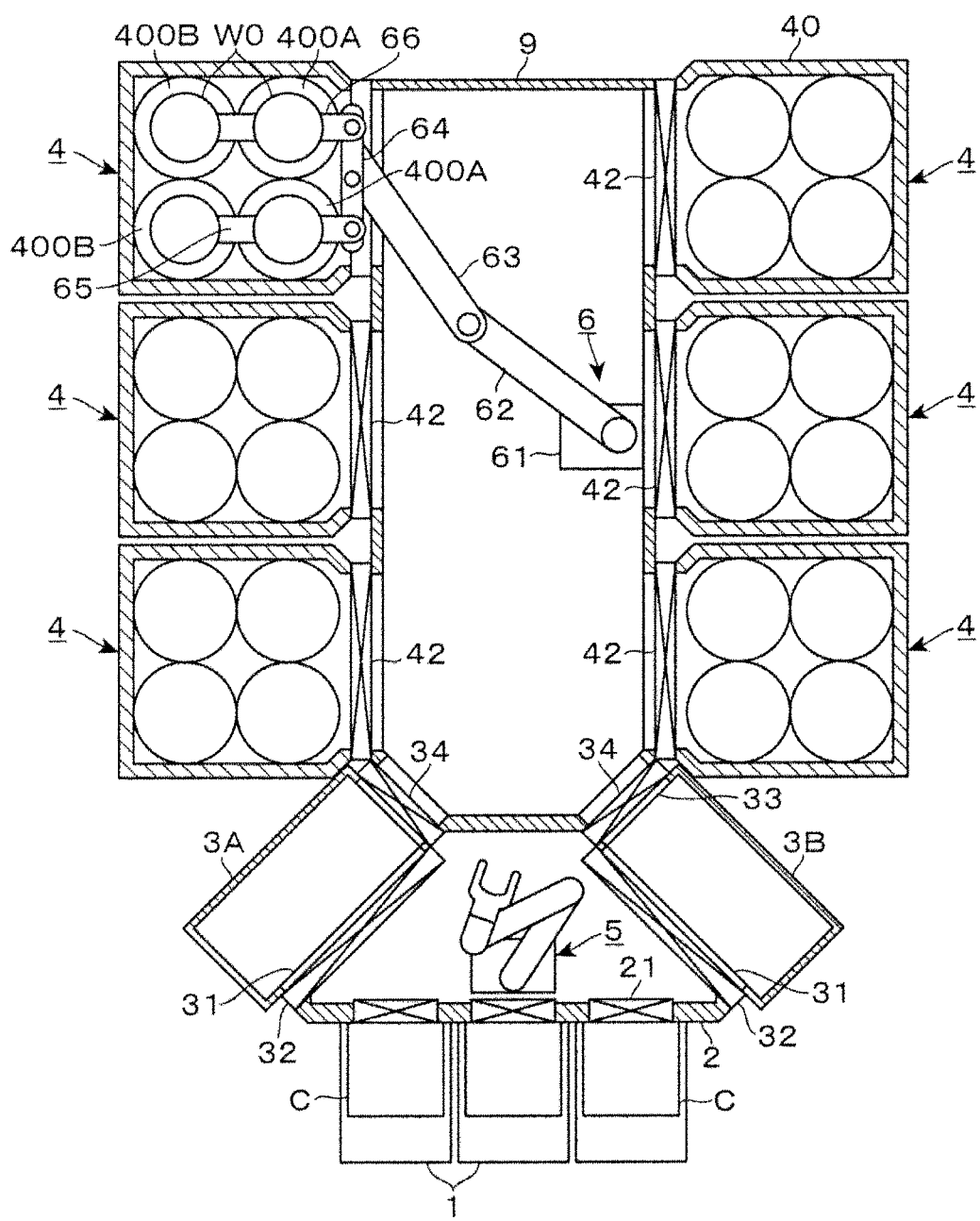
FIG. 12 is a plan view showing the operation of the embodiment of the present disclosure.

Next, as shown in FIG. 12, both of the first arm 65 and the second arm 66 enter the processing module 4 while maintaining the delivery posture. Then, the two wafers W0 held on the first arm 65 are positioned above the processing units 400A and 400B arranged on the left side when viewed from the loading/unloading port 41 of the processing module 4. Further, the two wafers W0 held on the second arm 66 are positioned above the processing units 400A and 400B arranged on the right side when viewed from the loading/unloading port 41 of the processing module 4.

Next, the lift pins 46 are lifted in each of the four processing units 400A and 400B to raise and receive the wafers W0 held on the first and the second arm 65 and 66. In this manner, the wafers W supported near the base portions and the tip portions of the first and the second arm 65 and 66 are mounted on the mounting table 11A of the processing unit 400A and the mounting table 11B of the processing unit 400B, respectively. Thereafter, the substrate transfer mechanism 6 is retracted to the transfer chamber 9, and the gate valve 42 is closed. Then, the above-described film formation is performed in the processing module 4.

As described above, when the wafer W is transferred to and from the processing module 4, the first arm 65 and the second arm 66 are in the delivery posture, and the height of the first substrate support region is the same as that of the second substrate support region. This is because such a configuration allows the height position and the width of loading and unloading port 41 to be the same on the right side and the left side when viewed toward the loading and unloading port 41. If the heights of the first arm 65 and the second arm 66 are different at the time of delivering the wafer to and from the processing module 4, the height position or the opening width of the loading/unloading port 41 becomes different on the right side and the left side.

The processing chamber 40 of the processing module 4 is made of metal and grounded, and the sidewall between the upper electrode and the lower electrode forms a conductive path to be in contact with plasma. Accordingly, the height position and the opening width of the loading/unloading port 41 may affect the plasma formation state. In other words, if the height position or the opening width of the loading/unloading port 41 are different on the right side and the left side, the plasma formation state becomes different on the right side and the left side in the processing chamber, and the processing uniformity between the wafer W mounted on the left side and the wafer W mounted on the right side may deteriorate. Since, however, the height of the first arm 65 and that of the second arm 66 are the same at the time of delivering the wafers to and from the processing module 4 as described above, the height and the width of the loading/unloading port 41 become the same on the right side and the left side. As a result, the deterioration in the processing uniformity between the wafers W can be avoided.

When the processing of the wafers W is completed in the processing module 4, the gate valve 42 in the processing module 4 is opened. Then, the processed wafers WA and WB (WA and WB being not shown) mounted on the four processing units 400A and 400B are lifted by the lift pins 46. Next, the first arm 65 and the second arm 66 change their posture to the delivery posture to deliver the wafers to and from the processing module 4, and then enter the processing module 4 at the same time. Thereafter, the wafers WA are delivered to and from the base portions of the first and the second arm 65 and 66 and the wafers WB are delivered to and from the tip portions of the first and the second arm 65 and 66 by the cooperative operation of the substrate transfer mechanism 6 and the lift pins.

Next, the first arm 65 and the second arm 66 supporting the processed wafers WA and WB are retracted to the transfer chamber 9, and the gate valve 42 is closed. Then, the substrate transfer mechanism 6 changes its posture to the above-described transfer posture. The substrate transfer mechanism 6 moves toward the load-lock module 3B while maintaining the transfer posture. The load-lock module 3B is maintained in the vacuum atmosphere. Then, the gate valve 34 of the load-lock module 3B is opened so that the first arm 65 holding the processed wafers WA and WB enters the load-lock module 3B and delivers the processed wafers WA and WB to the mounting shelves 300A and 300B.

Then, the first arm 65 is lowered to deliver the wafers WA and WB held by the first arm 65 to, e.g., the uppermost mounting shelves 300A and 300B. Thus, the two wafers W held by the first arm 65 are collectively delivered to the mounting shelves 300A and 300B of the load-lock module 3B.

Similarly, the second arm 66 holding the two processed wafers WA and WB enter the load-lock module 3B. Then, the two wafers W held by the second arm 66 are collectively delivered to, e.g., the second mounting shelves 300A and 300B from the top in the load-lock module 3B. Thereafter, the gate valve 34 of the load-lock module 3B is closed to switch the atmosphere in the load-lock module 3B to a normal pressure atmosphere. Then, the gate valve 32 is opened, and the processed wafer W is returned to, e.g., the original carrier C by the transfer arm 5.

In accordance with the above-described embodiment, the first arm 65 is connected to the rotating body 64 to be rotatable by the first rotary shaft 651, and the second arm 66 is connected to the rotating body 64 to be rotatable by the second rotary shaft 661. When the second arm 66 rotates, the second rotary shaft 661 is raised to avoid interference with the first arm 65. Therefore, the directions of the first arm 65 and the second arm 66 with respect to the rotating body 64 can be changed individually without interference with each other. Accordingly, it is possible to increase the degree of freedom in the arrangement of the wafers W in the module to which the wafers W are transferred and the transfer mode of the wafers W between the modules.

The first substrate support region and the second substrate support region support a plurality of, e.g., two wafers W, along the longitudinal directions of the first arm 65 and the second arm 66, respectively. Therefore, four wafers W can be transferred at one time in the case of using two arms 65 and 66, two wafers W can be transferred at one time in the case of using one arm 65 or 66. Accordingly, in this example, one substrate transfer mechanism 6 can deal with the collective transfer of the four wafers W and the collective transfer of the two wafers W. Hence, the wafers W can be delivered even when the arrangement of the wafers W is different between the modules, which makes it possible to increase the degree of freedom in the arrangement of the wafers W in the module and the transfer mode of the wafers W between the modules.

For example, in the case of using a substrate transfer mechanism for transferring four wafers W at one time, the time required for transferring the wafers W can be shortened. Therefore, the throughput can be increased and the productivity can be improved. At this time, however, it is required to arrange the four wafers W on the same plane in all the modules when viewed from above, the area occupied by the apparatus increases. On the other hand, in the case of using a substrate transfer mechanism for transferring two wafers W at one time, the wafers W can be transferred to the module in which four wafers W are mounted and the module in which two wafers W are mounted. Therefore, the module in which two wafers W are mounted side by side when viewed from above can be assembled to the substrate processing apparatus, which makes it possible to scale down the apparatus. Since, however, two wafers W are transferred to the module in which four wafers W are mounted, the transfer time increases.

Therefore, the configuration in which one substrate transfer mechanism 6 collectively transfers four wafers W to the module using the two arms 65 and 66 and collectively transfers two wafers W to the module using only one arm 65 or 66 is advantageous. In other words, the throughput can be increased due to the configuration of the processing module 4 in which the four wafers W are mounted on the same plane when viewed from above and collectively transferred. Further, due to the configuration of the load-lock modules 3A and 3B in which the two wafers W are mounted side by side when viewed from above and collectively transferred, the area occupied by the apparatus can be reduced compared to the configuration in which four wafers W are mounted. In this manner, the module in which four wafers W are mounted and the module in which two wafers W are mounted can be assembled to one substrate processing apparatus. Accordingly, the degree of freedom in the arrangement of the wafers W in the module increases, and the degree of freedom in the configuration of the apparatus increases.

Further, in the substrate transfer mechanism 6, the arms 55 and 56 can rotate individually with respect to the rotating body 64. Therefore, the arms 55 and 56 can deliver the wafers W to and from the load-lock modules 3A and 3B in a state where the load-lock modules 3A and 3B are arranged to be inclined with respect to the atmosphere transfer chamber when viewed from above. In other words, the width of the apparatus can be reduced when the load-lock modules 3A and 3B are arranged in front of the transfer chamber 9 compared to the case where the transfer chamber 2 is arranged in the right-left direction. In other words, the footprint of the apparatus can be suppressed.

Since the directions of the first arm 65 and the second arm 66 with respect to the rotating body 64 can be individually changed without interference with each other, the posture in which the first arm 65 and the second arm 66 cross with each other can be obtained. Therefore, the radius of rotation is reduced, and the scale of the transfer chamber 9 can be reduced due to the movement of the first arm 65 and the second arm 66 in that posture in the transfer chamber 9, which also contributes to the scaling down of the substrate processing apparatus. Further, the shape can be reduced by the posture in which the first arm 65 and the second arm cross with each other, thereby reducing the inertial mass. Since this facilitates acceleration and deceleration, the rotation can be quickly performed by the first moving body 62 and the second moving body, which is advantageous.

Figure 13:
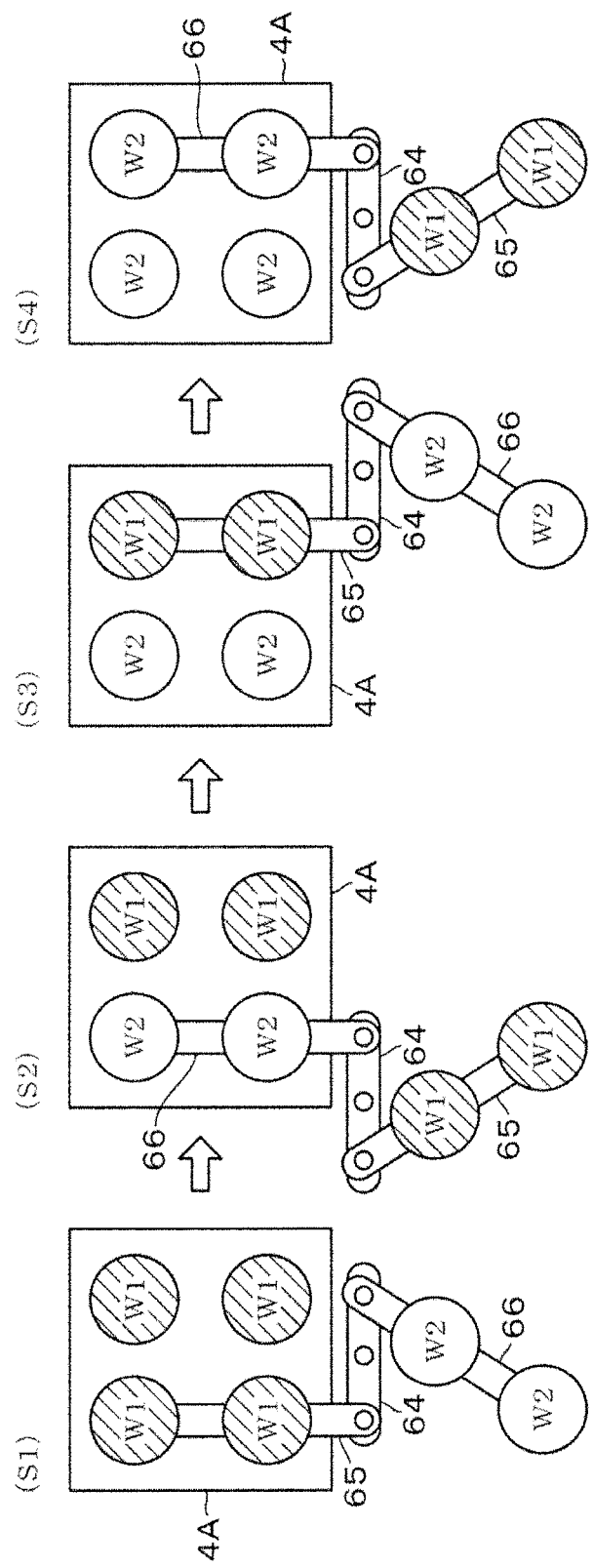
FIG. 13 is a plan view showing another example of delivery of substrates by the substrate transfer mechanism.

Hereinafter, another transfer example using the substrate transfer mechanism 6 of the present disclosure will be described with reference to FIG. 13. In this example, a wafer W processed in one processing module 4A connected to the transfer chamber 9 is transferred to another processing module 4B by the substrate transfer mechanism 6 and then is subjected to processing in the other processing module 4B. The reference numerals of the processing modules 4A and 4B are used for convenience of description, and the illustration of the processing module 4B is omitted. Further, the shapes of the first and the second arms 65 and 66 shown in FIG. 13 are examples for convenience of illustration, and are different from the shapes of the arms 65 and 66 at the time of the actual transfer operation. Here, an arm that is not supporting the wafer W is referred to as an "empty arm". A first wafer W1 indicates a wafer W1 processed in the processing module 4A, and a second wafer W2 indicates an unprocessed wafer W received from the load-lock module 3A.

First, as shown in S1 of FIG. 13, the first arm 65 enters the processing module 4A to receive the first wafers W1 that are first substrates stored in the processing module 4A. In other words, the empty first arm 65 enters the processing module 4A and receives the wafers W1 from the mounting tables 11A and 11B on the left side when viewed from the loading/unloading port. Then, the first arm 65 supporting the first wafers W1 is retracted from the processing module 4A.

Thereafter, as shown in S2 of FIG. 13, the second arm 66 supporting the second wafers W2 that are second substrates enters the processing module 4A to transfer the wafers W2 to the processing module 4A. After the second wafers W2 are delivered to the mounting tables 11A and 11B on the left side when viewed from the loading/unloading port, the empty second arm 66 is retracted from the processing module 4A.

Then, the first arm 65 supporting the first wafers W1 is transferred to, e.g., the processing module 4B where a next process is performed. The first arm 65 enters the processing module 4B to deliver the wafers W1 to the mounting tables 11A and 11B. Thereafter, the empty first arm 65 is retracted from the processing module 4B. The empty second arm 66 enters the load-lock module 3A to receive and support the unprocessed wafers W2.

Next, as shown in S3 of FIG. 13, the empty first arm 65 enters the processing module 4A to receive the first wafers W1 from the mounting tables 11A and 11B on the right side when viewed from the loading/unloading port in the processing module 4A. Then, the first arm 65 supporting the first wafers W1 is retracted from the processing module 4A. Thereafter, as shown in S4 of FIG. 13, the second arm 66 supporting the second wafers W2 that are the second substrates enters the processing module 4A to deliver the second wafers W2 to the mounting tables 11A and 11B on the right side when viewed from the loading/unloading port. Then, the empty second arm 66 is retracted from the processing module 4A. The above-described steps are executed based on the control signal outputted from control unit 100.

In this manner, the unprocessed wafers W2 are mounted on the four mounting tables 11A and 11B of the processing module 4A and subjected to a given process. On the other hand, in the processing module 4B, the above-described transfer operation is repeated. Accordingly, the wafers W1 are mounted on the four mounting tables 11A and 11B and subjected to the next process.

By using the substrate transfer mechanism 6 of the present disclosure, it is possible to collectively transfer two wafers W as well as four wafers W to the processing module 4. Therefore, a degree of freedom in the transfer process increases.

The rotary shaft 631 about which the rotating body 64 rotates is not necessarily separated from the first rotary shaft 651 and the second rotary shaft 661 in the horizontal direction. For example, the rotary shaft 631 and the first rotary shaft 651 may be overlapped with each other in the vertical direction, or the rotary shaft 631 and the second rotary shaft 661 may be overlapped with each other in the vertical direction. The second rotary shaft 661 may be raised and lowered by providing a motor for rotating the second rotary shaft 661 at the rotating body 64 and rotating the second rotary shaft 661 having a screw.

The second rotary shaft 661 is not necessarily raised and lowered using the screw. For example, the rotating body 64 may be provided with an elevating mechanism including a motor for rotating the second rotary shaft 661 and an actuator provided with the motor, and the second rotary shaft 661 may be raised and lowered by the elevating mechanism. In the respective examples, the rotary shaft is rotated by the motor. The rotary shaft may be rotated via the pulley and the belt as described with reference to FIG. 8 at a speed lower than that of the rotation of the motor. In addition, the rotary shaft may be rotated via a gear at a speed lower than that of the rotation of the motor, or the rotary shaft may be directly connected to and rotated by the motor.

When the posture in which the longitudinal directions of the first arm 65 and the second arm 66 are orthogonal to the straight line L (see FIG. 6A) is changed to avoid interference between the first arm 65 and the second arm 66, the second rotary shaft 661 may be lowered. Further, both of the elevating mechanism for raising and lowering the second rotary shaft 661 and the elevating mechanism for raising and lowering the first rotary shaft 651 may be provided. Moreover, it is also possible to raise one of the first rotary shaft 651 and the second rotary shaft 661 and lower the other one of the first rotary shaft 651 and the second rotary shaft 661 depending on the direction of the second arm 66 with respect to the rotating body 64. Although the above-described substrate transfer mechanism includes the first moving body 62 and the second moving body 63, the rotating body may be connected to one moving body.

The substrate processing apparatus of the present disclosure is merely an example, and it is also possible to assemble the processing modules in which two substrates are arranged on the front side and the rear side when viewed from the transfer chamber and collectively deliver two substrates between the substrate transfer mechanism and the processing module. Further, the load-lock module may be configured to mount four substrates in a 2×2 matrix shape when viewed from above, and four substrates can be collectively delivered to and from the load-lock module by the substrate transfer mechanism. In addition, it is possible to support the substrate at the tip portion of one of the first arm and the second arm and deliver a single substrate to a processing module in which a plurality of substrates is mounted or a processing module in which a single substrate is mounted. In the processing module, the process performed on the substrate in a vacuum atmosphere is not limited to the film formation, and may be etching or ashing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate transfer mechanism comprising:
a moving body moving horizontally;
a support body provided at the moving body to rotate about a vertical shaft;
a first rotary shaft and a second rotary shaft disposed vertically while being spaced apart from each other in a horizontal direction of the support body;
a first arm forming a first substrate support region for supporting a first substrate, the first arm having a base portion connected to the first rotary shaft and a tip portion rotating at an outer side of the support body;
a second arm forming a second substrate support region for supporting a second substrate different from the first substrate, the second arm having a base portion connected to the second rotary shaft and a tip portion rotating the outer side of the support body; and
an elevating mechanism configured to raise and lower the second rotary shaft depending on a direction of the second arm with respect to the support body to avoid interference between the first arm and the second arm,
wherein a relationship between the direction of the second arm with respect to the support body and a variation in a height position of the second arm is predetermined so that the height position of the second arm is determined based on the direction of the second arm with respect to the support body.

2. The substrate transfer mechanism of claim 1, wherein when a direction of the first arm is identical to the direction of the second arm, a height of the first substrate support region is identical to a height of the second substrate support region.

3. The substrate transfer mechanism of claim 2, wherein the first substrate support region supports a plurality of substrates along a longitudinal direction of the first arm and the second substrate support region supports a plurality of substrates along a longitudinal direction of the second arm.

4. The substrate transfer mechanism of claim 3, wherein the moving body moves in a state, when viewed from above, where longitudinal directions of the first arm and the second arm are inclined with respect to a straight line connecting the first rotary shaft and the second rotary shaft and the first arm and the second arm cross with each other.

5. The substrate transfer mechanism of claim 2, wherein the moving body moves in a state, when viewed from above, where longitudinal directions of the first arm and the second arm are inclined with respect to a straight line connecting the first rotary shaft and the second rotary shaft and the first arm and the second arm cross with each other.

6. The substrate transfer mechanism of claim 1, wherein the first substrate support region supports a plurality of substrates along a longitudinal direction of the first arm and the second substrate support region supports a plurality of substrates along a longitudinal direction of the second arm.

7. The substrate transfer mechanism of claim 6, wherein the moving body moves in a state, when viewed from above, where longitudinal directions of the first arm and the second arm are inclined with respect to a straight line connecting the first rotary shaft and the second rotary shaft and the first arm and the second arm cross with each other.

8. The substrate transfer mechanism of claim 1, wherein the moving body and the support body form an articulated arm.

9. The substrate transfer mechanism of claim 8, wherein the moving body moves in a state, when viewed from above, where longitudinal directions of the first arm and the second arm are inclined with respect to a straight line connecting the first rotary shaft and the second rotary shaft and the first arm and the second arm cross with each other.

10. The substrate transfer mechanism of claim 1, wherein the moving body moves in a state, when viewed from above, where longitudinal directions of the first arm and the second arm are inclined with respect to a straight line connecting the first rotary shaft and the second rotary shaft and the first arm and the second arm cross with each other.

11. The substrate transfer mechanism of claim 1, wherein said direction of the second arm with respect to the support body is a longitudinal direction of the second arm with respect to a longitudinal direction of the support body.

12. A substrate processing apparatus comprising:
a transfer chamber of a vacuum atmosphere;
a processing module connected to the transfer chamber and configured to process a substrate in a vacuum atmosphere;
a load-lock module connected to the transfer chamber;
a substrate transfer mechanism provided in the transfer chamber to transfer the substrate between the load-lock module and the processing module, the substrate transfer mechanism comprising:
a moving body moving horizontally,
a support body provided at the moving body to rotate about a vertical shaft,
a first rotary shaft and a second rotary shaft disposed vertically while being spaced apart from each other in a horizontal direction of the support body,
a first arm forming a first substrate support region for supporting a first substrate, the first arm having a base portion connected to the first rotary shaft and a tip portion rotating at an outer side of the support body,
a second arm forming a second substrate support region for supporting a second substrate different from the first substrate, the second arm having a base portion connected to the second rotary shaft and a tip portion rotating the outer side of the support body, and
an elevating mechanism configured to raise and lower the second rotary shaft depending on a direction of the second arm with respect to the support body to avoid interference between the first arm and the second arm, wherein a relationship between the direction of the second arm with respect to the support body and a variation in a height position of the second arm is predetermined so that the height position of the second arm is determined based on the direction of the second arm with respect to the support body; and a loader module on which a transfer container storing the substrate is mounted and through which the substrate is transferred between the transfer container and the load-lock module.

13. The substrate processing apparatus of claim 12, further comprising:
a controller configured to output a control signal for controlling the first arm and the second arm to enter the load-lock module sequentially and the first arm and the second arm to enter the processing module at the same time.

14. The substrate processing apparatus of claim 12, further comprising a controller configured to output a control signal for allowing the first arm to enter the processing module to receive the first substrate stored in the processing module, for retracting the first arm supporting the first substrate from the processing module, and for allowing a second arm supporting the second substrate to enter the processing module to transfer the second substrate to the processing module.

15. A substrate transfer method comprising:
horizontally moving a moving body;
rotating a support body provided at the moving body about a vertical shaft;
rotating a first rotary shaft and a second rotary shaft disposed vertically while being spaced apart from each other in a horizontal direction of the support body;
rotating a tip portion of a first arm at an outer side of the support body, the first arm forming a first substrate support region for supporting a first substrate and having a base portion connected to the first rotary shaft and the tip portion;
rotating a tip portion of a second arm at the outer side of the support body, the second arm forming a second substrate support region for supporting a second substrate different from the first substrate and having a base portion connected to the second rotary shaft and the tip portion; and
raising and lowering the second rotary shaft depending on a direction of the second arm with respect to the support body to avoid interference between the first arm and the second arm,
wherein a relationship between the direction of the second arm with respect to the support body and a variation in a height position of the second arm is predetermined so that the height position of the second arm is determined based on the direction of the second arm with respect to the support body.

16. The substrate transfer method of claim 15, wherein said direction of the second arm with respect to the support body is a longitudinal direction of the second arm with respect to a longitudinal direction of the support body.

* * * * *